United States Patent

Iino et al.

[11] Patent Number: 5,882,397
[45] Date of Patent: Mar. 16, 1999

[54] CRYSTAL PULLING METHOD

[75] Inventors: Eiichi Iino; Makoto Iida, both of Annaka; Masahiko Urano, Takasaki; Masanori Kimura, Annaka; Shozo Muraoka, Maebashi, all of Japan

[73] Assignee: Shin Etsu Handotai Co., Ltd., Tokyo, Japan

[21] Appl. No.: 944,869

[22] Filed: Oct. 6, 1997

[30]  Foreign Application Priority Data

Oct. 18, 1996 [JP] Japan ................................. 8-297457

[51] Int. Cl.⁶ .................................................. C30B 15/32
[52] U.S. Cl. ............................... 117/13; 17/14; 17/15; 17/208; 17/218
[58] Field of Search ................... 117/14, 15, 201, 117/202, 208, 13, 218

[56]  References Cited

U.S. PATENT DOCUMENTS

| | | | |
|---|---|---|---|
| 4,367,199 | 1/1983 | Jericho | 117/202 |
| 4,371,502 | 2/1983 | Sibley et al. | 117/202 |
| 4,916,955 | 4/1990 | Katsuoka et al. | 117/201 |

FOREIGN PATENT DOCUMENTS

| | | |
|---|---|---|
| A-62-288191 | 12/1987 | Japan . |
| A-3-295893 | 12/1991 | Japan . |
| A-7-172981 | 7/1995 | Japan . |
| A 8-212055 | 8/1996 | Japan . |

*Primary Examiner*—Felisa C. Hiteshew
*Attorney, Agent, or Firm*—Oliff & Berridge, PLC

[57]  ABSTRACT

In a crystal pulling method in which a growing single crystal is initially pulled by a seed chuck and subsequently pulled by lifting jig in the middle of the pulling operation, the speed $V_a$ of the seed chuck relative to the lifting jig is decreased, while the rising speed $V_b$ of the lifting jig increases, from a first point where switching of the pulling mechanism from the seed chuck to the lifting jig is started. The total speed $V_t = V_b + V_a$ is constantly maintained at a desired pulling speed V up to a third point where the shifting of the load from the seed chuck to the lifting jig is started. Subsequently, the total speed $V_t$ is made less than the desired pulling speed V from the third point where the shifting of the load from the seed shuck to the lifting jig is started. This enables accurate growth of a crystal.

2 Claims, 5 Drawing Sheets

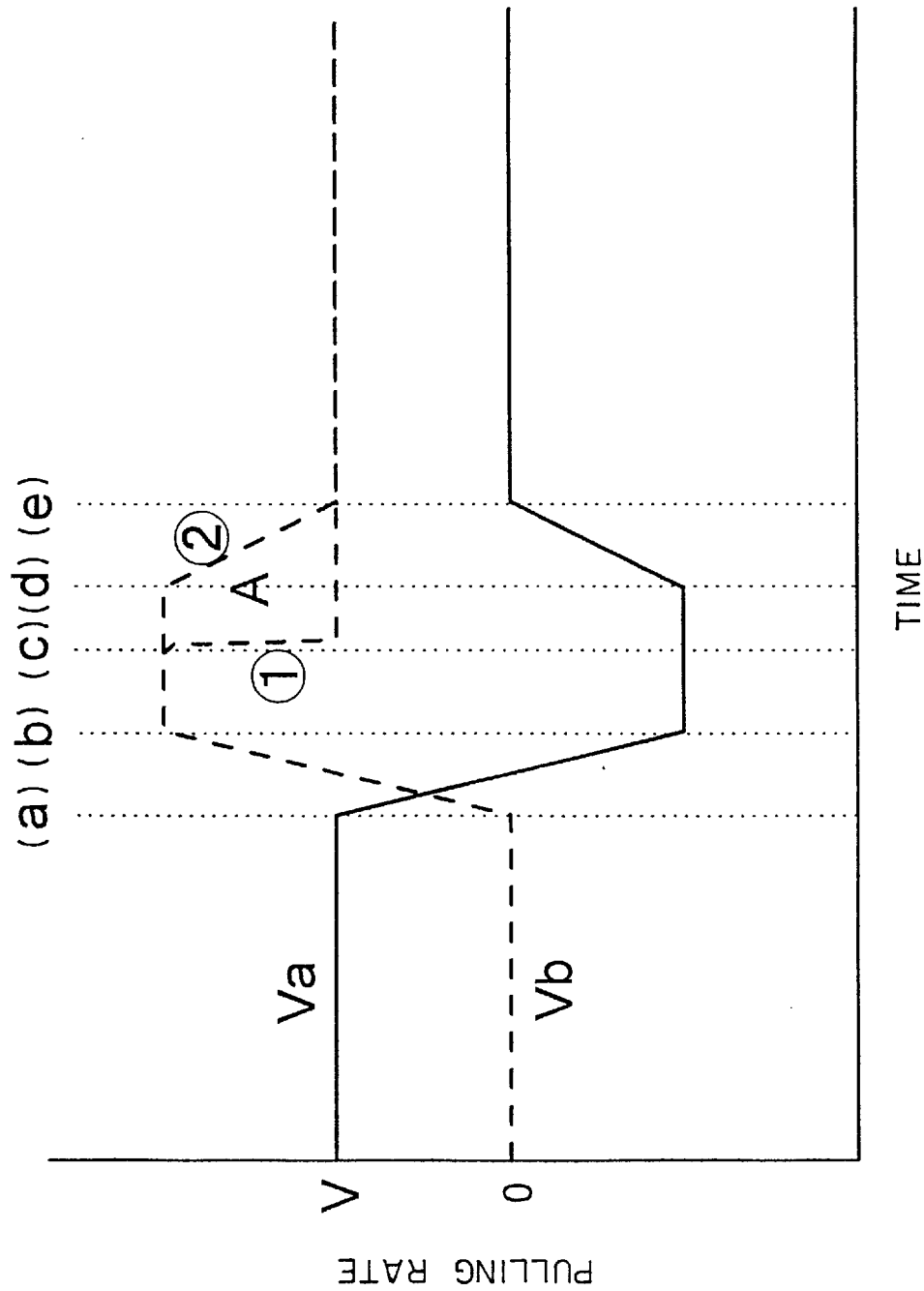

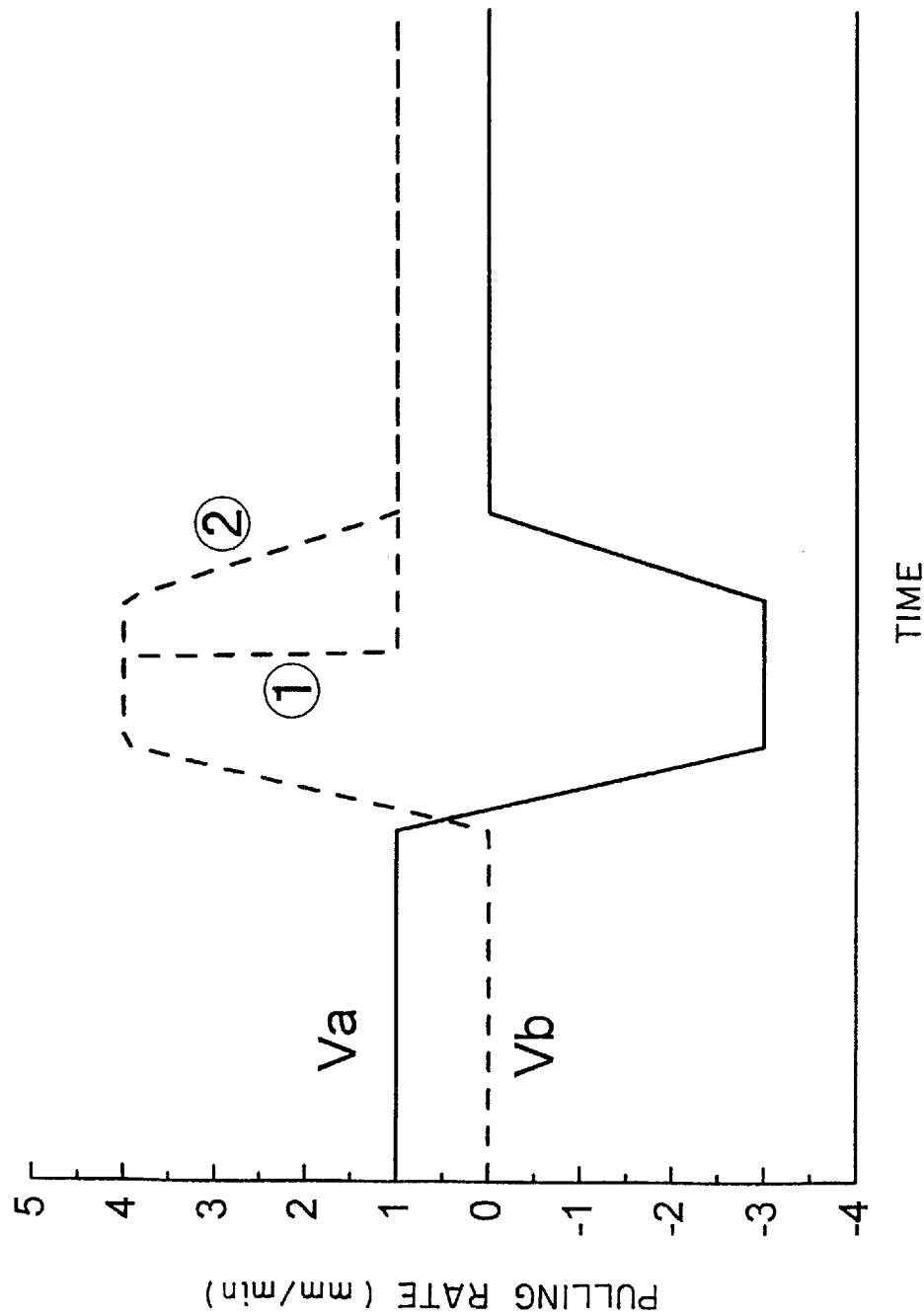

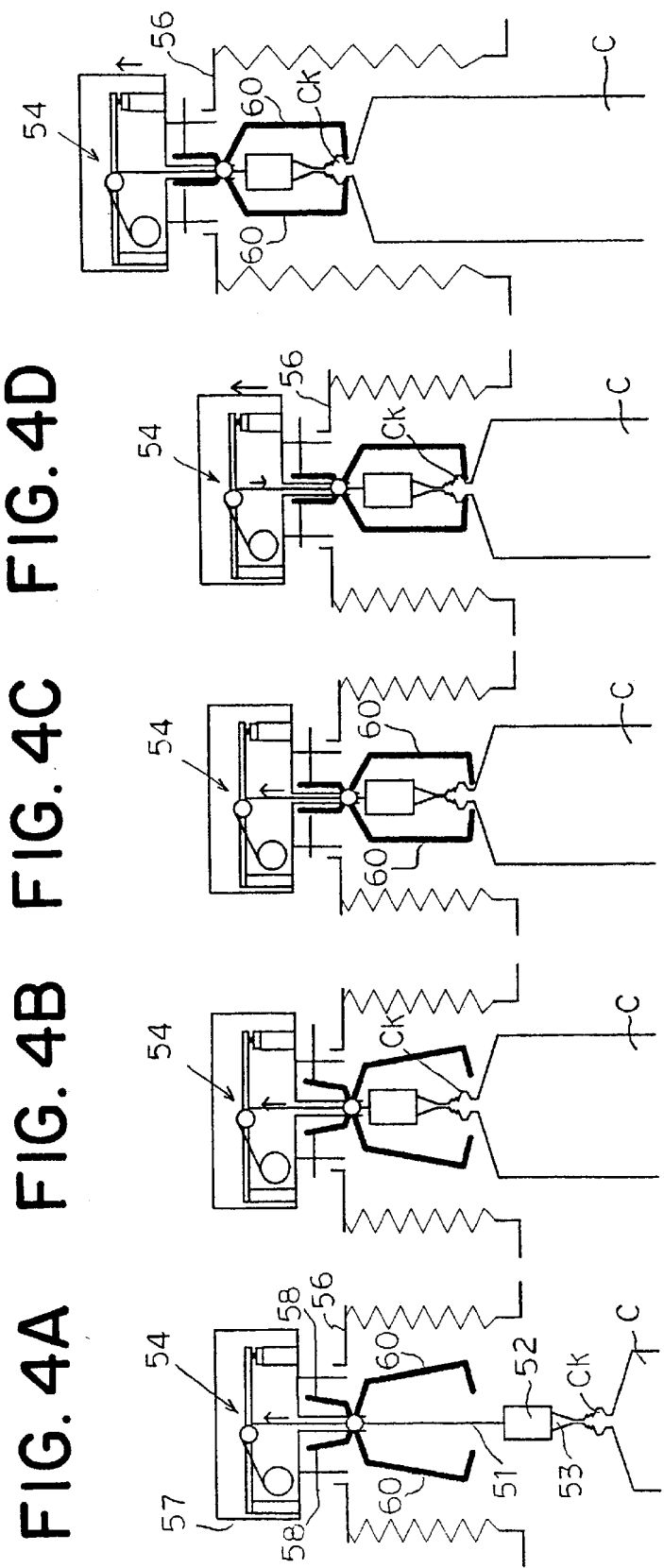

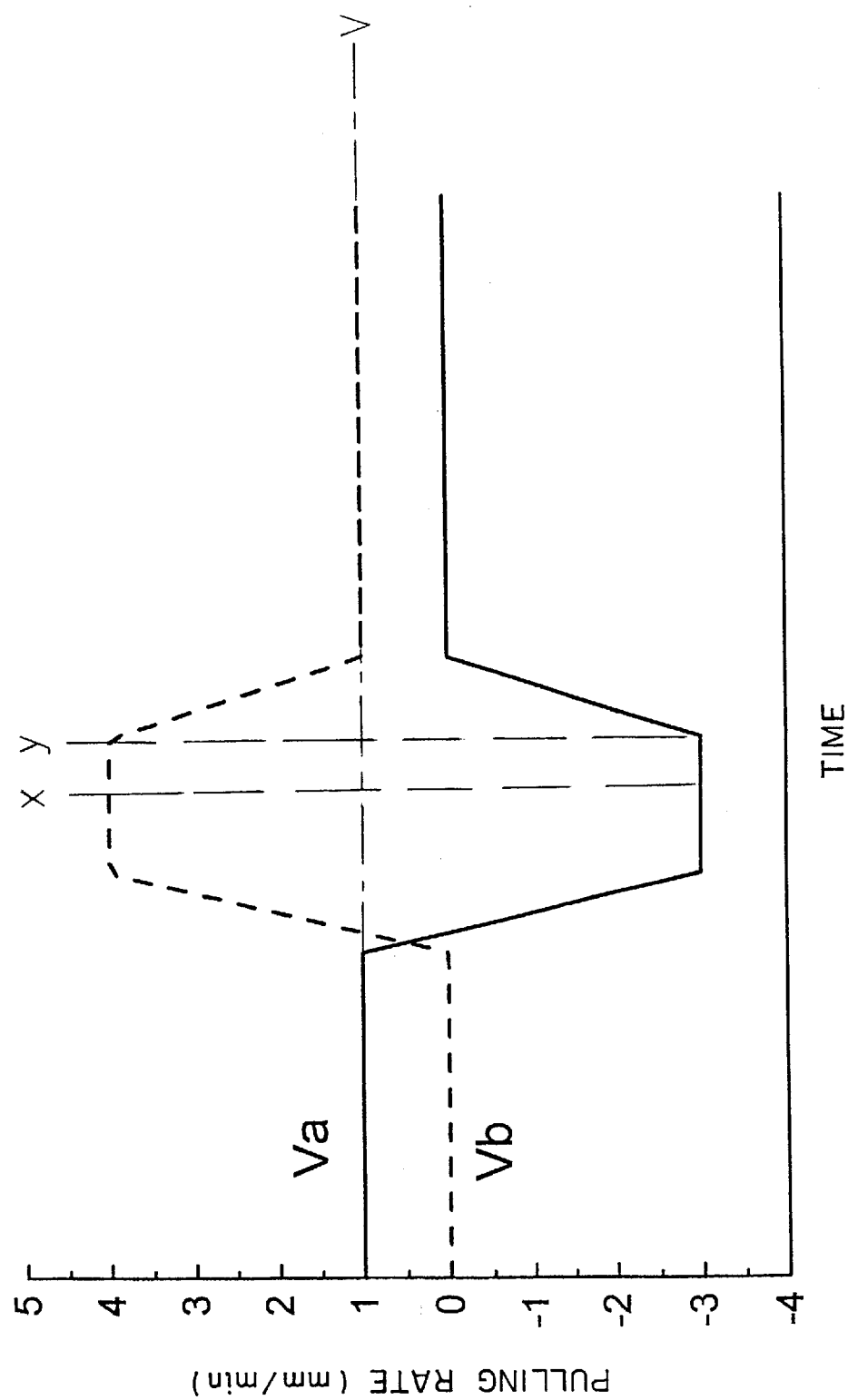

CRYSTAL PULLING METHOD

BACKGROUND OF THE INVENTION

1. Field of the Invention

The present invention relates to a crystal pulling method employing, for example, the Czochralski method (the CZ method), and particularly to an improvement on a technique for mechanically holding a heavy single crystal in order to pull the crystal safely and reliably, which improvement reduces variations in the diameter of a growing crystal at a point of time when the crystal is held, thereby enabling accurate growth of the crystal.

2. Description of the Related Art

Regarding a method of pulling a single crystal from a melt of a semiconductor material, such as silicon, contained in a crucible, the present inventors have proposed an improved pulling method as described in, for example, Japanese Patent Application No. 8-212055.

As shown in FIG. 4, in the pulling method, a seed crystal 53 held by a seed chuck 52 at the lower end of a wire 51 is brought into contact with material melt contained in an unillustrated crucible, and the seed crystal 53 is pulled by a seed chuck lifting mechanism 54 in order to grow a single crystal C below the seed crystal 53. In order to enable safe growth of the single crystal C, the pulling method employs an apparatus having the following structure: a retaining case 57 is mounted on a slider 56 which is vertically moved by an unillustrated slider moving mechanism; the seed chuck lifting mechanism 54 for winding the wire 51 is provided within the retaining case 57; and a lifting jig 60 composed of paired members is provided below the retaining case 57. The lower ends of the paired members of the lifting jig 60 are opened and closed through operation of cylinder units 58. At the beginning of pulling, the single crystal C is pulled by the seed chuck 52, and pulling by the seed chuck 52 is switched to pulling by the lifting jig 60 when the single crystal C grows and becomes heavy.

That is, initially, with the slider 56 fixed at a certain position, the seed crystal 53 held by the seed chuck 52 is brought into contact with the material melt, and subsequently the seed chuck 52 is pulled by the seed chuck lifting mechanism 54. As a result, as shown in FIG. 4A, a neck portion 59, a corrugated portion Ck, and the single crystal C are formed below the seed crystal 53.

When the corrugated portion Ck rises to a predetermined position shown in FIG. 4B, the lifting jig 60 is operated as shown in FIG. 4C such that the lower end portions of the paired members of the lifting jig 60 approach the smaller-diameter portion of the corrugated portion Ck with a clearance remaining therebetween. Subsequently, as shown in FIG. 4D, the slider 56 is raised, while the seed chuck lifting mechanism 54 is operated in reverse in order to lower the single crystal C relative to the slider 56, such that the larger-diameter portion of the corrugated portion Ck comes into contact with and sits on the lifting jig 60.

At this time, as shown in FIG. 5, control is performed such that the total speed Vt=Vb+Va (where Vb represents the rising speed of the slider 56 and Va represents the speed of the seed chuck 52 relative to the slider 56) becomes constant. It is to be noted that when the seed chuck 52 moves downward relative to the slider 56, the value Va becomes negative. During the second half of the control, the corrugated portion Ck contacts the lifting jig 60 at, for example, point x, and a predetermined portion of the entire load of the crystal is shifted to the lifting jig 60 before point y, and the seed chuck 52 is stopped at the point y. With this operation, pulling by the seed chuck lifting mechanism 54 is switched to pulling by the lifting jig 60 (4E).

In the above-described technique, since the total speed Vt=Vb+Va is controlled so as to be constant when the pulling means is switched from the seed chuck to the lifting jig, the actual pulling speed (growth rate) of a crystal is constantly maintained at a desired pulling speed V. This control is effective for growing a crystal while guaranteeing high accuracy of, for example, the diameter of the crystal. However, through further experimental studies, the inventors of the present invention have found that accuracy of a crystal, particularly the accuracy of the diameter of the crystal, can be improved further if the control conditions are changed at a point (point x) in time when the shifting of the load to the lifting jig is started.

SUMMARY OF THE INVENTION

An object of the present invention is to provide a method for pulling a single crystal which enables accurate growth of a heavy single crystal in accordance with, for example, the CZ method.

Anther object of the present invention is to provide a method for pulling a single crystal which enables more accurate growth of a single crystal in the second half of the period of switching the pulling means from a seed chuck lifting mechanism to a lifting jig.

In order to achieve the above object, the present invention provides a crystal pulling method comprising the steps of: bringing a seed crystal held by a seed chuck into contact with material melt in a crucible; raising the seed chuck in order to grow a single crystal below the seed crystal; when the single crystal reaches a predetermined position, closing a lifting jig such that the lifting jig faces a predetermined portion of the crystal with a small clearance therebetween; and switching pulling means from the seed chuck to the lifting jig and simultaneously causing a relative vertical movement between the crystal and the lifting jig in order to shift the load of the crystal from the seed chuck to the lifting jig, wherein the total speed Vt of the rising/descending speed Va of the seed chuck relative to the lifting jig and the rising speed Vb of the lifting jig is maintained at a desired pulling speed V until shifting of the load from the seed chuck to the lifting jig is started, is made lower than the desired pulling speed V when the shifting of the load is started, and the speed Vb is then made equal to the desired pulling speed V when a predetermined portion of the load has been shifted.

The results of experiments carried out repeatedly by the inventors of the present invention have revealed a trend that the actual pulling speed of a crystal depends on the rising speed Vb of the lifting jig from an early stage (point x in FIG. 5) during which shifting of the load of a single crystal from the seed chuck to the lifting jig has been started, so that the crystal is pulled at a speed close to the speed Vb when the crystal load is shifted to the lifting jig slightly.

This trend became more remarkable when the lifting jig did not deform and no slippage occurred at the holding portion. Even when the lifting jig deformed and slippage occurred at the holding portion, the above-described trend was observed to be notable.

When pulling is performed such that the total speed Vt=Vb+Va is maintained constant even after point x in FIG. 5, the actual speed exceeds the desired pulling speed V due to the speed Vb being set to be greater than the desired pulling speed V. When the actual pulling speed differs from the preset pulling speed, a crystal deforms. When the degree of deformation of the crystal is large, the growth of the crystal must be stopped, yield is decreased due to the generation of diametric shortage, the distribution of concentration of impurities such as oxygen contained in the crystal varies, and other problems occur. Therefore, the conventional method is not preferred.

In the present invention, in order to solve the above-described drawbacks, through an improved control in which the total speed Vt is maintained at a desired pulling speed V until the start of shifting of the load of the seed chuck to the lifting jig, but is made less than the desired pulling speed v when the shifting of the load has been started.

When the deformation of the lifting jig and the like is small, the speed Vb is set to be equal to the desired pulling speed V in order to make the total speed Vt less than the desired pulling speed V when the shifting of the load is started.

As described above, when the lifting jig does not deform and no slippage occurs, the dependence of the pulling speed of the crystal on the rising speed Vb of the lifting jig becomes the strongest, so that the crystal is started to be pulled at a speed substantially equal to the rising speed Vb when the load has been slightly shifted to the lifting jig.

Therefore, the control can be performed such that when the shifting of the load to the lifting jig has been started (point x in FIG. 5), the rising speed Vb of the lifting jig is made equal to the desired pulling speed V and at the same time the relative speed Va of the seed chuck is made zero. However, if the relative speed Va of the seed chuck is made zero, it becomes impossible to shift the load of the crystal to the lifting jig.

In order to solve this problem, when shifting of the load is started, the rising speed Vb of the lifting jig is made equal to the desired pulling speed V and the relative speed Va of the seed chuck is maintained negative (i.e., the seed chuck is moved downward) until a predetermined portion of the load has been shifted; and when the predetermined portion of the load has been shifted, the relative speed Va of the seed chuck is made zero, with the result that the rising speed Vb becomes equal to the desired pulling speed V.

According to the method of the present invention, each crystal can be grown with higher accuracy compared to the case where pulling is performed while the total speed V is maintained constant from the beginning to the end. Therefore, there can be solved the drawbacks involved in the conventional method, such as discontinuation of growth of a crystal due to deformation thereof, a decrease in yield due to the generation of diametric shortage, and variations in the distribution of concentration of impurities such as oxygen contained in the crystal.

BRIEF DESCRIPTION OF THE DRAWINGS

FIG. 2 is a graph showing variations in the speeds(rates) of the seed chuck and the lifting jig, wherein Va represents the relative rising/descending speed of the seed chuck relative to the lifting jig, and Vb represents the rising speed of the lifting jig;

FIG. 3 is a graph showing an example of a specific pulling speed(rate) in the embodiment;

FIGS. 4A–4E are views showing a conventional crystal pulling method; and

FIG. 5 is a graph showing variations in the speeds(rates) of the seed chuck and the lifting jig in the conventional pulling method.

DESCRIPTION OF THE PREFERRED EMBODIMENT

Figure 1:
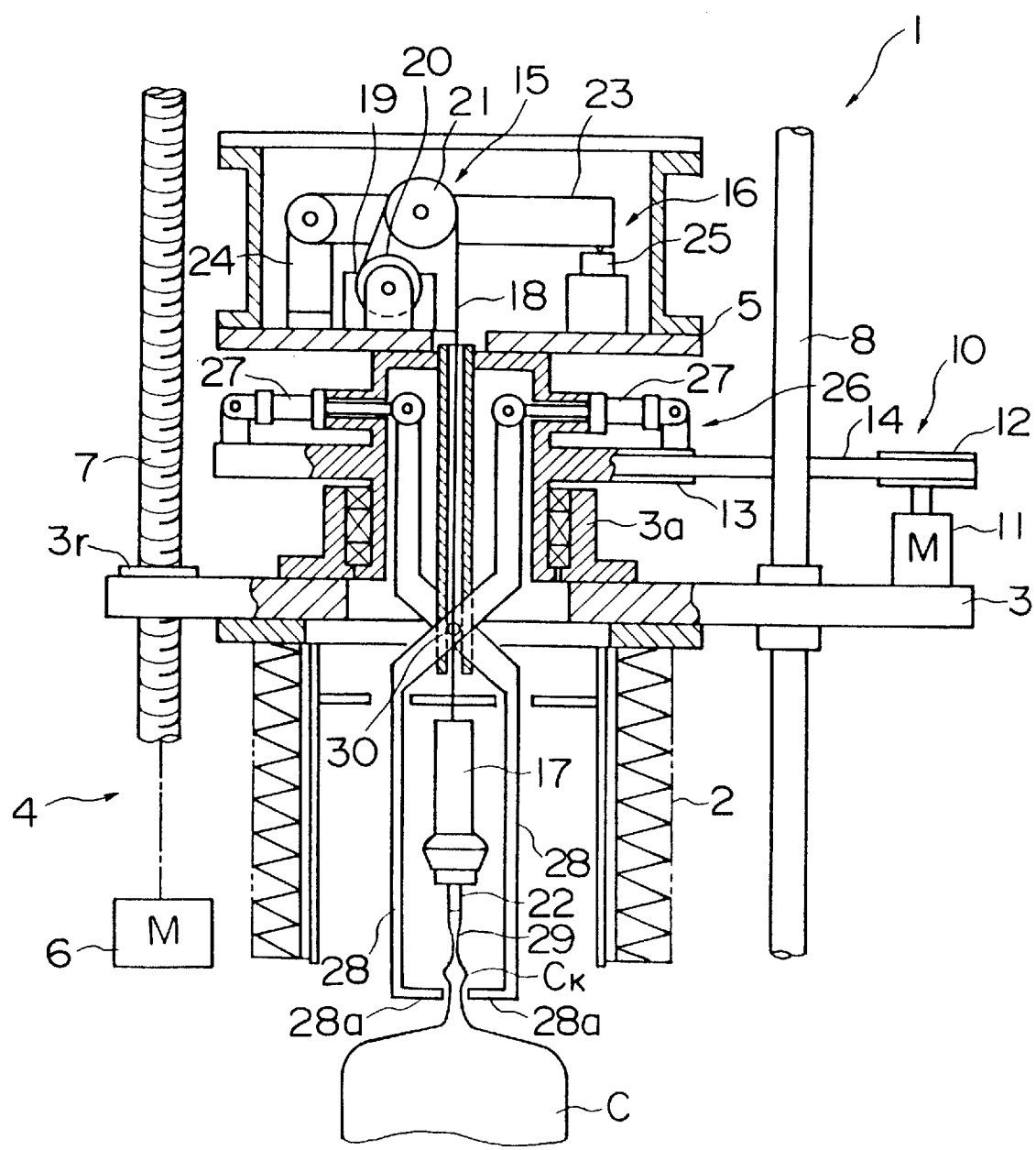
FIG. 1 is a schematic view showing the structure of a main portion of a crystal pulling apparatus.

An embodiment of the present invention will now be described in detail with reference to the drawings.

The crystal pulling method of the present invention employs the Czochralski method (CZ method) for growing a crystal of, for example, a semiconductor material such as silicon, and is suited for the safe and reliable growth of accurate heavy single crystals. First, with reference to FIG. 1, a description will be given of the basic structure of the crystal pulling apparatus which is used to carry out the crystal pulling method according to the present invention.

A crystal pulling apparatus 1 comprises an unillustrated lower chamber which contains an unillustrated crucible, an expandable bellows chamber 2 attached to the upper portion of the lower chamber, and a slider 3 attached to the upper portion of the bellows chamber 2. The slider 3 is moved vertically by an elevating mechanism 4. On the slider 3, a retaining case 5 is rotatably supported by a cylindrical bearing 3a.

The elevating mechanism 4 comprises a ball screw 7 that is rotated about a vertical axis by a drive motor 6, a screw-engagement portion 3r of the slider 3 which is in screw-engagement with the ball screw 7, and a guide bar 8 for guiding vertical movement of the slider 3. As the ball screw 7 is rotated, the slider 3 moves vertically, while the bellows chamber 2 expands and contracts.

The retaining case 5 is rotated about a vertical center axis by a rotation mechanism 10. The rotation mechanism 10 comprises a rotation motor 11 attached to the upper surface of the slider 3 at one end thereof, a small-diameter pulley 12 attached to the output shaft of the motor 11, a large-diameter pulley 13 provided integrally on the outer circumference of the retaining case 5, and a belt 14 fitted around and extending between the small-diameter pulley 12 and the large-diameter pulley 13. As the motor 11 operates, the retaining case 5 rotates about the vertical center axis.

In the upper portion of the retaining case 5 are disposed a seed chuck lifting mechanism 15 and a load measurement mechanism 16. The seed chuck lifting mechanism 15 includes a guide pulley 21 and a winding drum 20 for winding a wire 18 by a motor 19, to the tip end of which is attached the seed chuck 17. A seed crystal 22 is held at the tip end of the seed chuck 17.

The load measurement mechanism 16 comprises an arm 23 for supporting the guide pulley 21, a support member 24 on which the base end of the arm 23 is pivotably supported, and a load cell 25 on which the tip end of the arm 23 rests. When the single crystal C being grown is pulled by the seed chuck lifting mechanism 15, the load which acts on the load cell 25 via the guide pulley 21 and the arm 23 is measured in order to determine the weight of the single crystal C.

In the middle portion of the retaining case 5 is provided a lifting jig drive mechanism 26. This lifting jig drive mechanism 26 includes a pair of open/close cylinder units 27 attached to the retaining case 5, and a pair of members which constitute a lifting jig 28 and are connected to the tip ends of the piston rods of the cylinder units 27. The lifting jig 28 has a scissors-like shape in which the intermediate portions of the paired members of lifting jig 28 are coupled together via a pin 30 for pivotal movement. Therefore, when the cylinder units 27 are operated, crystal holding portions 28a provided at the lower end of the paired members of the lifting jig 28 are opened and closed.

The drive motor 6 of the elevating mechanism 4, the rotation motor 11 of the rotation mechanism 10, the motor 19 of the seed chuck lifting mechanism 15, the load cell 25 of the load measurement mechanism 16, and the open/close cylinder units 27 of the lifting jig drive mechanism 26 are connected to an unillustrated controller in order to control them in a synchronized manner.

A method of pulling a single crystal through use of a crystal pulling apparatus having the above-described structure will now be described.

First, the seed crystal 22 held by the seed chuck 17 is brought into contact with the surface of material melt contained in the crucible. Then, the wire 18 is wound up at a predetermined speed by the seed chuck lifting mechanism 15, while the retaining case 5 is gently rotated by operation of the rotation motor 11 of the rotation mechanism 10. Thus, a neck portion 29, a corrugated portion Ck, and a single crystal C are formed below the seed crystal 22.

Subsequently, when the corrugated portion Ck of the single crystal C is pulled to a predetermined position, the open/close cylinder units 27 are operated in order to close the paired members of the lifting jig 28, so that tip ends of the crystal holding portions 28a are caused to approach a smaller-diameter portion of the corrugated portion Ck with a clearance being left therebetween, so that the upper portions of the crystal holding portions 28a come into contact with the larger-diameter portion of the corrugated portion Ck.

When the crystal holding portions 28a are closed, switching of the pulling means is started. That is, the slider 3, which has been stopped, is raised in order to gradually raise the lifting jig 28, and the pulling speed of the seed chuck 17 is gradually decreased. After the switching of the pulling means is started, the speed of the seed chuck 17 and the speed of the lifting jig 28 vary as shown in the graph of FIG. 2.

In FIG. 2, Va represents the speed of the seed chuck 17 relative to the lifting jig 28, and Vb represents the rising speed of the lifting jig 28 (slider 3). In the graph of FIG. 2, (a) is a point where the switching of the pulling means is started, (b) is a point where Va and Vb become constant, (c) is a point where the shifting of the crystal load acting on the seed chuck 17 to the lifting jig 28 is started, (d) is a point where a predetermined portion of the load has been shifted to the lifting jig 28, and (e) is a point where the switching of the pulling means has been completed.

That is, at point (a), the lifting jig 28 starts to rise, and at the same time, the seed chuck 17 starts to decelerate. During the period from point (a) to point (b), the rising movement of the lifting jig 28 and the descending movement of the seed chuck 17 are controlled such that the total speed vt (=Vb+va) becomes equal to the desired pulling speed V. During the period between point (a) and point (b), the relative speed Va of the seed chuck 17 becomes negative; i.e., the seed chuck 17 moves downward relative to the lifting jig 28. As a result, the larger diameter portion of the corrugated portion Ck, which has been located above the crystal holding portions 28a, starts to approach the crystal holding portions 28a.

The above-described procedures are the same as those used in the conventional method, and the slopes of the speeds Va and Vb between point (a) and point (b) can be set freely as in the conventional method.

In the present invention, when the shifting of the crystal load to the lifting jig 28 starts at point (c), the pulling operation is performed such that the total speed Vt becomes less than the desired pulling speed V (where Vt=Vb−Va). That is, in the conventional method, pulling operation is performed in accordance with pattern ② in which the total speed Vt is maintained equal to the desired pulling speed V even after point (c). The inventors of the present invention found that a crystal can be grown more accurately when the total speed Vt is made less than the desired pulling speed V at point (c). The present invention was made based on this finding.

That is, from point (c) where the shifting of the crystal load starts, the actual pulling speed depends greatly on the rising speed Vb of the lifting jig 28, with the result that the actual pulling speed exceeds the target pulling speed V. This trend becomes remarkable when the lifting jig 28 does not deform and no slippage occurs between the lifting jig 28 and the corrugated portion Ck. In such a case, the rising speed Vb of the lifting jig 28 is preferably made equal to the desired or target pulling speed V at point (c) as shown by pattern ①.

The above-described trend is notable even when deformation or the like occurs in the lifting jig 28.

The reason for this is considered to be that when the lifting jig 28 does not deform at all, a crystal is brought into a state in which it cannot move vertically relative to the lifting jig 28 when the crystal load has been shifted slightly. That is, in order to allow the crystal to move vertically relative to the lifting jig 28, shifting must occur at the contact point between the lifting jig 28 and the crystal. However, when the lifting jig 28 does not deform at all, such a phenomenon does not occur.

By contrast, in the case where deformation occurs in the lifting jig 28, although the actual pulling speed is strongly affected by the rising speed vb of the lifting jig 28 as described above, the crystal moves slightly downward relative to the lifting jig 28 due to the deformation of the lifting jig 28 or the like. Accordingly, this downward movement must be compensated through setting the rising speed Vb of the lifting jig 28 greater than the desired pulling speed V.

In the case where the pulling is performed while the total speed Vt (=Vb+Va) is maintained constant even after point (c), the speed va of the seed chuck 17 is maintained negative in order to shift the crystal load to the lifting jig 28. Accordingly, the rising speed Vb is constantly greater than the desired pulling speed V, with the result that the actual pulling speed exceeds the desired pulling speed V.

Because of the above-mentioned reasons, in the case where the lifting jig 28 does not deform at all, the crystal is pulled at a speed greater than the desired pulling speed V because the rising speed Vb of the lifting jig 28 is greater than the desired pulling speed V. Even in the case where the lifting jig 28 deforms, this deformation can be compensated by a slight change in the rising speed Vb of the lifting jig 28 in an amount corresponding to the deformation. Therefore, when the pulling is performed while the total speed Vt is maintained constant, the actual pulling speed exceeds the desired pulling speed V.

In order to solve the above-described problem, in the present invention, when the lifting jig 28 deforms, the pulling is performed such that the rising speed Vb of the lifting jig 28 falls within the zone A between the patterns ① and ②; i.e., the total speed Vt becomes less than the desired pulling speed V. When the lifting jig 28 do not deform, the pulling is performed according to pattern ①.

Preferably, an optimal rising speed in the zone A is empirically determined through experiments based on the strength of the lifting jig 28, the weight of a crystal at the time when the crystal load is shifted, and other factors.

During the period between point (c) and point (e), the relative speed Va of the seed chuck 17 is maintained negative (i.e., the seed chuck 17 is moved downward), as in the conventional method, in order to shift the crystal load acting on the seed chuck 17 to the lifting jig 28. The ratio of the load to be shifted can be determined freely. However, if the ratio is too large, the wire 18 becomes slackened. Since such a slackening of the wire 18 is undesirable, 1 to 50% of the load which has acted on the seed chuck 17 is shifted.

When a predetermined portion of the load has been shifted, the relative speed Va of the seed chuck 17 is made zero, and when the control is set such that the rising speed Vb of the lifting jig 28 falls within the zone between the patterns ① and ②, the rising speed Vb of the lifting jig 28 is made equal to the desired pulling speed V in order to complete the switching of the pulling means.

EXAMPLE

The present invention will be described by way or example. However, the present invention is not limited thereto.

A crystal having a diameter of 6" was grown in accordance with the CZ method in which the rising speed Vb of the lifting jig 28 was changed in accordance with each of the patterns ① and ② shown in FIG. 3. In the middle of pulling, the pulling means was switched from the seed chuck 17 to the lifting jig 28. For this test, there were used two kinds of lifting jigs 28, one of which hardly deformed and the other of which deformed, in order to measure the degree of deformation of the crystal generated when the crystal load was shifted.

For the case where the crystal was pulled by the lifting jig 28 which hardly caused deformation, the test results show that the diameter of the crystal changed in an amount of −0.2 mm when the rising speed Vb of the lifting jig 28 was changed in accordance with pattern ①, and that the diameter of the crystal changed in an amount of −9.0 mm when the rising speed Vb of the lifting jig 28 was changed in accordance with pattern ②.

For the case where the crystal was pulled by the lifting jig 28 which caused deformation, the test results show that the diameter of the crystal changed in an amount of +3.2 mm when the rising speed Vb of the lifting jig 28 was changed in accordance with pattern ①, and that the diameter of the crystal changed in an amount of −6.0 mm when the rising speed Vb of the lifting jig 28 was changed in accordance with pattern ②.

Accordingly, it has been proved that in the case where the crystal was pulled by the lifting jig 28 which hardly causes deformation, pattern ① is effective, and in the case where the crystal was pulled by the lifting jig 28 which causes deformation, the zone A between the patterns ① and ② is effective.

The present invention is not limited to the above-described embodiment. The above-described embodiment is a mere example, and those having the substantially same structure as that described in the appended claims and providing the similar action and effects are included in the scope of the present invention.

What is claimed is:

1. A crystal pulling method comprising the steps of:

bringing a seed crystal held by a seed chuck into contact with a material melt in a crucible;

raising the seed chuck so to grow a single crystal below the seed crystal;

closing a lifting jig when the single crystal reaches a predetermined position such that the lifting jig faces a portion of the single crystal with a small clearance between the lifting jig and the single crystal; and switching pulling means of the single crystal from the seed chuck to the lifting jig and simultaneously causing a relative vertical movement between the single crystal and the lifting jig so as to shift the load of the single crystal from the seed chuck to the lifting jig, wherein the total speed Vt which equals the sum of the speed Va of the seed chuck relative to the lifting jig and the rising speed Vb of the lifting jig is (i) maintained at a pulling speed V until the shifting of the load from the seed chuck to the lifting jig is started, and (ii) made lower than the pulling speed V when the shifting of the load is started, and wherein the rising speed Vb is made equal to the pulling speed V when a portion of the load has been shifted to the lifting jig.

2. A crystal pulling method according to claim 1, wherein when deformation of the lifting jig is small, the rising speed Vb of the lifting jig is equal to the pulling speed V so as to make the total speed Vt less than the pulling speed V when the shifting of the load is started.

* * * * *